US008329383B2

(12) United States Patent
Memetea et al.

(10) Patent No.: US 8,329,383 B2
(45) Date of Patent: Dec. 11, 2012

(54) NEGATIVE-WORKING LITHOGRAPHIC PRINTING PLATE PRECURSORS

(75) Inventors: Livia T. Memetea, Loveland, CO (US); Jianbing Huang, Trumbull, CT (US)

(73) Assignee: Eastman Kodak Company, Rochester, NY (US)

( * ) Notice: Subject to any disclaimer, the term of this patent is extended or adjusted under 35 U.S.C. 154(b) by 554 days.

(21) Appl. No.: 12/612,915

(22) Filed: Nov. 5, 2009

(65) Prior Publication Data

US 2011/0104450 A1 May 5, 2011

(51) Int. Cl.
*G03F 7/00* (2006.01)
*G03F 7/26* (2006.01)
*B41F 7/00* (2006.01)

(52) U.S. Cl. .................. 430/302; 430/270.1; 101/450.1; 101/453; 101/463.1

(58) Field of Classification Search ............... 430/270.1, 430/302; 101/450.1, 453, 463.1
See application file for complete search history.

(56) References Cited

U.S. PATENT DOCUMENTS

| | | | | |
|---|---|---|---|---|
| 6,309,792 | B1 | 10/2001 | Hauck et al. | |
| 7,303,857 | B2 | 12/2007 | Goto | |
| 7,425,400 | B2 | 9/2008 | Goto | |
| 2002/0197564 | A1 | 12/2002 | Timpe et al. | |
| 2003/0118939 | A1 | 6/2003 | Munnelly et al. | |
| 2004/0175648 | A1 | 9/2004 | Goto | |
| 2004/0259027 | A1 * | 12/2004 | Munnelly et al. | 430/270.1 |
| 2005/0003285 | A1 | 1/2005 | Hayashi et al. | |
| 2009/0111051 | A1 | 4/2009 | Tao et al. | |
| 2009/0162783 | A1 | 6/2009 | Levanon et al. | |
| 2010/0047723 | A1 * | 2/2010 | Levanon et al. | 430/325 |

FOREIGN PATENT DOCUMENTS

| | | | |
|---|---|---|---|
| EP | 1 506 855 | A2 | 2/2005 |
| EP | 1506855 | A2 * | 2/2005 |
| WO | 2004/041544 | | 5/2004 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A negative-working lithographic printing plate precursor have an outermost imageable layer that includes an oxygen scavenger and shelf-life stabilizer that is represented by either Structure (I) or Structure (II) below:

$$HOOC—Ar—N(R_1)(R_2) \quad (I)$$

$$HOOC—R_5—N(R_6)(R_7) \quad (II)$$

wherein Ar is a phenylene or naphthylene group, $R_1$ and $R_2$ are independently alkyl, alkenyl, alkynyl, phenyl, phenoxy, $—R_5OH$, $—CH_2—C(═O)—R_3$, or $—CH_2—C(═O)O—R_4$ groups, $R_3$ is hydrogen or an alkyl or phenyl group, $R_4$ is an alkyl or phenyl group, $R_5$ is an alkylene group, $R_6$ and $R_7$ are independently hydrogen or an alkyl, $—R_5OH$, $—R_5C(═O)—R_8$, or $—R_5C(═O)OR_9$ group, $R_8$ is hydrogen or an alkyl group, and $R_9$ is an alkyl group, provided that the oxygen scavenger has no more than one carboxyl group.

18 Claims, No Drawings

NEGATIVE-WORKING LITHOGRAPHIC PRINTING PLATE PRECURSORS

FIELD OF THE INVENTION

This invention relates to negative-working imageable elements such as lithographic printing plate precursors that have improved shelf life stability. This invention also relates to a method of providing imaged and processed lithographic printing plates without a baking step between imaging and processing.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation-sensitive compositions that can be used to generate free radicals upon thermal imaging and imageable elements containing same are described in numerous publications such as U.S. Pat. No. 6,309,792 (Hauck et al.) describing negative-working elements that include polycarboxylic acids. Other IR-sensitive negative-working elements are described in U.S. Patent Application 2009/0111051 (Tao et al.) and WO 2004/041544 (Munnelly et al.).

In many instances, such negative-working imageable elements require a topcoat over the imageable layer to act as an oxygen barrier to provide desired shelf life and sensitivity, but there is a desire to eliminate this extra layer because of material costs and the need for additional coating equipment. The presence of the topcoat often requires an extra washing step before the imaged layer is developed in a suitable developer or it will reduce the developer life in a processing cycle of an automatic processor. The elimination of the topcoat, however, negatively impacts the sensitivity and shelf-life (stability over time) of the printing plate precursor. It is desirable to eliminate this oxygen barrier topcoat without any loss in sensitivity and shelf-life stability. Moreover, other imageable elements require a baking step between imaging and development (processing) in order to increase image wearability, but it would also be desirable to eliminate this extra step for the user (customer) without any loss in imaging speed (imaging sensitivity).

SUMMARY OF THE INVENTION

The present invention provides a negative-working lithographic printing plate precursor comprising a substrate and having thereon a negative-working imageable layer as the outermost layer, the imageable layer comprising:

a) a polymeric binder, b) a free radically polymerizable component, c) an initiator composition that provides free radicals upon exposure to imaging radiation, and d) an oxygen scavenger and shelf-life stabilizer that is represented by either Structure (I) or Structure (II) below:

$$HOOC—Ar—N(R_1)(R_2) \quad (I)$$

$$HOOC—R_5—N(R_6)(R_7) \quad (II)$$

wherein Ar is a phenylene or naphthylene group, $R_1$ and $R_2$ are independently alkyl, alkenyl, alkynyl, phenyl, phenoxy, $—CH_2—C(═O)—R_3$, $—CH_2—C(═O)O—R_4$, or $—R_5OH$ groups, $R_3$ is hydrogen or an alkyl or phenyl group, $R_4$ is an alkyl or phenyl group, $R_5$ is an alkylene group, $R_6$ and $R_7$ are independently hydrogen or an alkyl, $—R_5OH$, $—R_5C(═O)—R_8$, or $—R_5C(═O)OR_9$ group, $R_8$ is hydrogen or an alkyl group, and $R_9$ is an alkyl group, provided that the oxygen scavenger has no more than one carboxyl group.

In addition, this invention provides a method of producing a lithographic printing plate comprising:

A) imagewise exposing the lithographic printing plate precursor of the present invention to provide exposed and non-exposed regions, and B) without a baking step, developing the imagewise exposed precursor to remove the non-exposed regions.

In some embodiments, of this invention, the lithographic printing plate precursor comprises an oxygen scavenger that is 4-(N,N-dimethylamino)benzoic acid, 4-(N,N-diethylamino)benzoic acid, 4-[N,N-bis(2-hydroxyethyl)amino]benzoic acid, N,N-dihydroxyethyl glycine, N,N-dihydroxymethyl glycine, or a mixture thereof that is present in an amount of from 1 to 7 weight %, wherein the infrared radiation absorbing compound is an infrared radiation absorbing dye, and the initiator composition further comprises a tetraarylborate salt and an onium salt that form the same salt.

Thus, this method can be used to provide a lithographic printing plate.

The negative-working lithographic printing plate precursors of this invention provide a number of advantages including the elimination of topcoats. Thus, the imageable layer is the outermost layer of the precursors and yet shelf life stability is not diminished. In addition, the "preheat" or baking step used between imaging and development can be eliminated, thereby simplifying the process for using the precursors to form lithographic printing plates, without any significant loss in imaging speed.

These advantages were unexpectedly found by incorporating certain oxygen scavengers (see Structures I and II) into the imageable layer of the precursors.

DETAILED DESCRIPTION OF THE INVENTION

Definitions

Unless the context indicates otherwise, when used herein, the terms "imageable element", "lithographic printing plate precursor", "printing plate precursor", and "precursor" are meant to be references to embodiments of the present invention.

In addition, unless the context indicates otherwise, the various components described herein such as "oxygen scavenger", "polymeric binder", free radical generating compounds", "infrared radiation absorbing compound", and similar terms also refer to mixtures of such components. Thus, the use of the articles "a", "an", and "the" is not necessarily meant to refer to only a single component.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The radiation-sensitive compositions and imageable layers used in this invention include one or more "oxygen stabilizers" or "shelf-life stabilizers" as defined below. Such compounds appear to stabilize the composition to improve shelf life over time and thus may also be considered "aging inhibitors", "aging retarders", or "oxygen inhibitors". They may also act as developability enhancing compounds.

Such oxygen scavengers can be represented by either Structure (I) or Structure (II) below:

$$HOOC—Ar—N(R_1)(R_2) \quad (I)$$

$$HOOC—R_5—N(R_6)(R_7) \quad (II)$$

wherein Ar is a phenylene or naphthylene group, either of which can be further substituted with one or more groups that do not interfere with the intended effects of the compounds.

$R_1$ and $R_2$ are independently substituted or unsubstituted linear or branched alkyl groups having 1 to 10 carbon atoms, substituted or unsubstituted linear or branched alkenyl groups having 2 to 10 carbon atoms, substituted or unsubstituted linear or branched alkynyl groups having 2 to 10 carbon atoms, substituted or unsubstituted phenyl groups (such as alkylphenyl groups), substituted or unsubstituted phenoxy groups (such alkylphenoxy groups where the alkyl groups have 1 to 4 carbon atoms), $—R_5OH$ (such as hydroxymethyl or 2-hydroxyethyl groups), $—CH_2—C(═O)—R_3$, or $—CH_2—C(═O)O—R_4$ groups. $R_3$ is hydrogen or a substituted or unsubstituted alkyl or phenyl groups (as defined above). $R_4$ is a substituted or unsubstituted alkyl or phenyl group (as defined above). $R_5$ is a substituted or unsubstituted linear or branched alkylene group having 1 to 10 carbon atoms. $R_6$ and $R_7$ are independently hydrogen or a substituted or unsubstituted alkyl group (as defined above), $—R_5OH$, $—R_5C(═O)—R_8$, or $—R_5C(═O)OR_9$ group. $R_8$ is hydrogen or a substituted or unsubstituted alkyl group (as defined above), and $R_9$ is a substituted or unsubstituted alkyl group (as defined above).

The oxygen scavengers have no more than one carboxyl group in each molecule.

In some embodiments, Ar is substituted or unsubstituted phenylene, $R_1$ and $R_2$ are independently unsubstituted alkyl or hydroxyalkyl group having 1 to 4 carbon atoms, $R_5$ is a substituted or unsubstituted alkylene group having 1 to 4 carbon atoms, $R_6$ and $R_7$ are independently hydrogen or a substituted or unsubstituted alkyl group having 1 to 4 carbon atoms or an $—R_5OH$ group wherein $R_5$ is a substituted or unsubstituted alkylene group having 1 to 4 carbon atoms. In most embodiments, these groups are not further substituted.

In still other embodiments, $R_1$ and $R_2$ are independently unsubstituted alkyl groups having 1 to 3 carbon atoms, $R_5$ is an unsubstituted alkylene group having 1 or 2 carbon atoms, and $R_6$ and $R_7$ are independently $—R_5OH$ groups wherein $R_5$ is an unsubstituted alkylene group having 1 or 2 carbon atoms.

Representative oxygen scavengers include but are not limited to, 4-(N,N-dimethylamino)benzoic acid, 4-(N,N-diethylamino)benzoic acid, 4-[N,N-bis(2-hydroxyethyl)amino] benzoic acid, N,N-dihydroxyethyl glycine, N,N-dihydroxymethyl glycine, and mixtures of two or more of these compounds.

The oxygen scavenger is generally present in an amount of from about 0.1 to about 20 weight %, or typically from 1 to 7 weight %.

The oxygen scavengers useful in this invention can be obtained from a number of commercial sources as noted in the Examples below.

The imageable elements include a radiation-sensitive imaging composition disposed on a suitable substrate to form a radiation-sensitive (particularly IR-sensitive) imageable layer. The imageable elements may have any utility wherever there is a need for an applied coating that is crosslinkable using suitable radiation, and particularly where it is desired to remove non-exposed regions of the coating instead of exposed regions. The radiation-sensitive compositions can be used to prepare printed forms such as lithographic printing plate precursors that are defined in more detail below.

The radiation-sensitive composition (imageable layer) can include one or more polymeric binders that are generally used for off-press developability such as any alkaline solution soluble (or dispersible) polymer having an acid value of from about 20 to about 400 (typically from about 30 to about 200). The following described polymeric binders are useful in this manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly (alkylene oxide) (meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By “tertiary carbon”, we refer to a carbon atom in the all carbon backbone that has three valences filled with radicals or atoms other than a hydrogen atom (which fills the fourth valence). By “non-tertiary carbon”, we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group (“X”) that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

V. Polymeric binders can have pendant 1H-tetrazole groups as described in U.S. Application Publication 2009/0142695 (noted above) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly (urethane-acrylic) hybrids that are distributed (usually uniformly) throughout the imageable layer. Some poly (urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

Some polymeric binders are present as discrete particles having an average diameter of from 50 nm to 1 μm, or typically from 50 to 500 nm.

Other polymeric binders are used to promote on-press develop ability, and include but are not limited to, those that are not generally crosslinkable and are usually present as discrete particles (not-agglomerated). Such polymers can be present as discrete particles having an average particle size of from about 10 to about 500 nm, and typically from 100 to 450 nm, and that are generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight ($M_n$) of at least 5,000 and typically at least 20,000 and up to 100,000, or from 30,000 to 80,000, as determined by Gel Permeation Chromatography.

Useful particulate polymeric binders generally include polymeric emulsions or dispersions of polymers having hydrophobic backbones to which are attached pendant poly (alkylene oxide) side chains, cyano side chains, or both, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and US Patent Application Publication 2005/0003285 (Hayashi et al.) that are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 to 500,000, or from about 100,000 to about 300,000, as determined by dynamic light scattering.

The polymeric binder is generally present in the radiation-sensitive composition (and imageable layer) in an amount of at least 5 and up to 70 weight %, and typically from about 10 to about 50 weight % based on the total solids in the composition and layer.

Thus, the radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (Bauman et al.) that include 1H-tetrazole groups.

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The one or more free radically polymerizable components (monomeric, oligomeric, or polymeric) can be present in the imageable layer in an amount of at least 10 weight % and up to 80 weight %, and typically from about 20 to about 50 weight %, based on the total dry weight of the imageable layer. The weight ratio of the free radically polymerizable component to the total polymeric binders (described below) is generally from about 5:95 to about 95:5, and typically from 10:90 to 90:10, or even from 30:70 to 70:30.

This radiation-sensitive composition also includes an initiator composition that includes one or more initiators that are capable of generating free radicals sufficient to initiate polymerization of all the various free radically polymerizable components upon exposure of the composition to imaging radiation.

The radiation-sensitive composition includes an initiator composition that is capable of generating radicals sufficient to initiate polymerization of the radically polymerizable component upon exposure to the appropriate imaging radiation. The initiator composition may be responsive, for example, to electromagnetic radiation in the infrared spectral regions, corresponding to the broad spectral range of from about 700 nm to about 1400 nm, and typically from 700 nm to 1250 nm. Alternatively, the initiator composition may be responsive to exposing radiation in the ultraviolet or violet region of from about 150 to about 475 nm and typically from 250 to 450 nm.

In general, suitable initiator compositions for IR-radiation and violet-radiation sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). For "violet"-sensitive compositions, initiators include but not limited to, hexaarylbiimidazoles, oxime esters, or trihalomethyl substituted triazines.

Useful initiator compositions for IR radiation sensitive compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S.

Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference. Thus, the initiator composition can include a tetraarylborate salt such as a tetraphenylborate salt, and in some embodiments this tetraarylborate salt and the onium salt can be the same salt (that is, a salt having a tetraarylborate cation and an onium anion such an iodonium anion).

Useful IR radiation-sensitive initiator compositions can comprise one or more diaryliodonium borate compounds, each of which is represented by the following Structure (III):

(III)

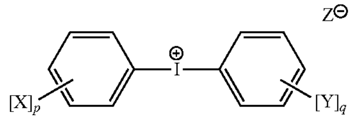

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). For example, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are useful (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions, and or particularly at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure I, p and q are independently 0 or integers of 1 to 5, provided that either p or q is from about 1. For example, both p and q can be 1. Thus, it is understood that the carbon atoms in the phenyl rings that are not substituted by X or Y groups have a hydrogen atom at those ring positions.

$Z^-$ is an organic borate anion represented by the following Structure (IV):

(IV)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

For example, $R_1$, $R_2$, $R_3$, and $R_4$ are independently substituted or unsubstituted alkyl or aryl groups as defined above, or at least 3 of $R_1$, $R_2$, $R_3$, and $R_4$ are the same or different substituted or unsubstituted aryl groups (such as substituted or unsubstituted phenyl groups). In some embodiments, all of $R_1$, $R_2$, $R_3$, and $R_4$ are the same or different substituted or unsubstituted aryl groups or, all of the groups are the same substituted or unsubstituted phenyl group. For example, $Z^-$ is a tetraphenyl borate wherein the phenyl groups are substituted or unsubstituted.

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The iodonium cations and boron-containing anions are generally present in the imageable layer in a combined amount of at least 1% and up to and including 15%, and typically at least 4 and up to and including 10%, based on total dry weight of the imageable layer.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 300 nm and up to and including 450 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describe useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated $\pi$-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

In many embodiments, the imageable layers generally comprise a radiation-sensitive imaging composition that includes one or more infrared radiation absorbing compounds. Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 4,973,572 (DeBoer et al.), U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Suitable dyes may be formed using conventional methods and starting materials or obtained from various commercial sources including American Dye Source (Baie D'Urfe, Quebec, Canada) and FEW Chemicals (Germany).

Some useful infrared radiation absorbing dyes have a tetraaryl pentadiene chromophore. Such chromophores generally include a substituted or unsubstituted pentadiene linking group having 5 carbon atoms in the chain, to which are attached two substituted or unsubstituted aryl groups at each end of the linking group.

Useful infrared radiation absorbing dyes can also be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the IR-sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to one skilled in the art, depending upon the specific compound used to provide the desired chromophore.

Useful IR-radiation sensitive compositions are described, for example, in the following patent, publications, and copending patent applications, all of which are incorporated herein by reference:

U.S. Pat. No. 7,452,638 (Yu et al.),

U.S. Patent Application Publication 2008/0254387 (Yu et al.),

U.S. Patent Application Publication 2008/0299488 (Yu et al.),

U.S. Patent Application Publication 2008/0311520 (Yu et al.),

U.S. Ser. No. 12/104,544 (filed Apr. 17, 2008 by Ray et al.), and

U.S. Ser. No. 12/177,208 (filed Jul. 22, 2008 by Yu et al.).

Thus, some particularly useful embodiments include IR-radiation sensitive compositions that include an infrared radiation absorbing dye and an onium salt such as an iodonium salt, and such embodiments can also include an iodonium tetraarylborate.

The radiation-sensitive composition (imageable layer) can further comprise one or more phosphate (meth)acrylates each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.).

The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The negative-working lithographic printing plate precursors can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition and it is the outermost layer in the element. Thus, the element does not include what is conventionally known as an overcoat (or an oxygen barrier or oxygen impermeable topcoat) applied to and disposed over the imageable layer. This overcoat layer is not needed since the oxygen scavengers described above are present.

The substrate generally has a hydrophilic surface, or at least a surface that is more hydrophilic than the applied infrared radiation-sensitive composition on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use. Typically, the support can be any self-supporting aluminum-containing material including aluminum sheets.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and phosphoric acid anodized aluminum support that provides a hydrophilic surface for lithographic printing.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm. The substrate can also be a cylindrical aluminum surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an outermost imageable layer.

Illustrative of such manufacturing methods is mixing the various components needed for a specific imaging chemistry including oxygen scavenger, polymeric binder, initiator composition, radiation absorbing compound, and any other components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$.

Layers can also be present under the imageable layer to enhance developability or to act as a thermal insulating layer.

Once the various layers have been applied and dried on the substrate, the negative-working imageable elements can be enclosed in water-impermeable material that substantially inhibits the transfer of moisture to and from the element and "heat conditioned" as described in U.S. Pat. No. 7,175,969 (noted above) that is incorporated herein by reference.

Imaging Conditions

During use, the imageable element is exposed to a suitable source of exposing radiation depending upon the radiation absorbing compound present in the radiation-sensitive composition to provide specific sensitivity that is at a wavelength of from about 150 to about 475 nm or from about 700 to about 1400 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can be configured as a flatbed recorder or as a drum recorder, with the imageable member mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.).

Imaging with infrared radiation can be carried out generally at imaging energies of at least 30 $mJ/cm^2$ and up to and including 500 $mJ/cm^2$, and typically at least 50 and up to and including 300 $mJ/cm^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 $mJ/cm^2$ and up to and including 0.5 $mJ/cm^2$, and typically at least 0.02 and up to and including about 0.1 $mJ/cm^2$. It would be desirable, for example, to image the UV/visible radiation-sensitive imageable elements at a power density in the range of at least 0.5 and up to and including 50 $kW/cm^2$ and typically of at least 5 and up to and including 30 $kW/cm^2$, depending upon the source of energy (violet laser or excimer sources)

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Unlike many known methods, after imaging of negative-working imageable elements, a "preheating" or baking step is not needed to accelerate the formation of a latent image before development.

In addition, because there is no topcoat, a pre-rinse step is not needed between imaging and development.

Development and Printing

After imaging, the imaged elements can be processed "off-press" using a suitable processing solution described herein. Such processing is carried out for a time sufficient to remove predominantly only the non-exposed regions of the imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development can be accomplished using what is known as "manual" development, "dip" development, or processing with an automatic development apparatus (processor). In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as hydroxides, bicarbonates, phosphates, and organic amines). The pH of the developer is generally greater than 6 and up to 14 and at least 7 and up to 12. The imaged elements are generally developed using conventional processing conditions. Both aqueous alkaline developers and organic solvent-containing developers can be used.

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-based developers include ND-1 Developer, Developer 980, Developer 1080, 2 in 1 Developer, 955 Developer, D29 Developer (described below), and 956 Developer (all available from Eastman Kodak Company). These developers can be diluted with water if desired.

In some instances, a single processing solution is used to both develop the imaged element by removing predominantly the non-exposed regions and also to provide a protective layer or coating over the entire imaged and developed outer surface. In this aspect, the processing solution can behave somewhat like a gum that is capable of protecting the lithographic image on the printing plate against contamination or damage (for example, from oxidation, fingerprints, dust, or scratches). Such processing solutions are described for example in copending and commonly assigned U.S. Ser. No. 12/104,544 (filed Apr. 17, 2008 by K. Ray, Yu, and Saraiya) that is incorporated herein by reference. Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

The processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). As noted above, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following off-press development, the resulting lithographic printing plate can be postbaked with or without blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements used in this invention are "on-press" developable particularly when the elements contain a polymeric binder in the imageable layer in the form of discrete particles. The imaged element is directly mounted onto a printing press after step B wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The present invention provides at least the following embodiments and combinations thereof:

1. A negative-working lithographic printing plate precursor comprising a substrate and having thereon a negative-working imageable layer as the outermost layer, the imageable layer comprising:

a) a polymeric binder, b) a free radically polymerizable component, c) an initiator composition that provides free radicals upon exposure to imaging radiation, and d) an oxygen scavenger and shelf-life stabilizer that is represented by either Structure (I) or Structure (II) below:

$$HOOC—Ar—N(R_1)(R_2) \quad (I)$$

$$HOOC—R_5—N(R_6)(R_7) \quad (II)$$

wherein Ar is a phenylene or naphthylene group, $R_1$ and $R_2$ are independently alkyl, alkenyl, alkynyl, phenyl, phenoxy, —$R_5$OH, —$CH_2$—C(═O)—$R_3$, or —$CH_2$—C(═O)O—$R_4$ groups, $R_3$ is hydrogen or an alkyl or phenyl group, $R_4$ is an alkyl or phenyl group, $R_5$ is an alkylene group, $R_6$ and $R_7$ are independently hydrogen or an alkyl, —$R_5$OH, —$R_5$C(═O)—$R_8$, or —$R_5$C(═O)O$R_9$ group, $R_8$ is hydrogen or an alkyl group, and $R_9$ is an alkyl group, provided that the oxygen scavenger has no more than one carboxyl group.

2. The lithographic printing plate precursor of embodiment 1 wherein Ar is phenylene, $R_1$ and $R_2$ are independently unsubstituted alkyl or hydroxyalkyl having 1 to 4 carbon atoms, $R_5$ is an alkylene having 1 to 4 carbon atoms, $R_6$ and $R_7$ are independently hydrogen or an alkyl group having 1 to 4 carbon atoms or an —$R_5$OH group wherein $R_5$ is an alkylene group having 1 to 4 carbon atoms.

3. The lithographic printing plate precursor of embodiment 1 or 2 wherein $R_1$ and $R_2$ are independently alkyl groups having 1 to 3 carbon atoms, $R_5$ is an alkylene having 1 or 2 carbon atoms, and $R_6$ and $R_7$ are independently —$R_5$OH groups wherein $R_5$ is an alkylene group having 1 or 2 carbon atoms.

4. The lithographic printing plate precursor of any of embodiments 1 to 3 wherein the oxygen scavenger is 4-(N,N-dimethylamino)benzoic acid, 4-(N,N-diethylamino)benzoic acid, 4-[N,N-bis(2-hydroxyethyl)amino]benzoic acid, N,N-dihydroxyethyl glycine, N,N-dihydroxymethyl glycine, or a mixture thereof.

5. The lithographic printing plate precursor of any of embodiments 1 to 4 wherein the oxygen scavenger is present in an amount of from about 0.1 to about 20 weight %.

6. The lithographic printing plate precursor of any of embodiments 1 to 5 wherein the oxygen scavenger is present in an amount of from 1 to 7 weight %.

7. The lithographic printing plate precursor of any of embodiments 1 to 6 wherein the polymeric binder is present as discrete particles having an average diameter of from 50 nm to 1 μm.

8. The lithographic printing plate precursor of any of embodiments 1 to 7 wherein the initiator composition comprises an onium salt and an infrared radiation absorbing compound.

9. The lithographic printing plate precursor of embodiment 8 wherein the infrared radiation absorbing compound is an infrared radiation absorbing dye.

10. The lithographic printing plate precursor of embodiment 8 wherein the initiator composition further comprises a tetraarylborate salt.

11. The lithographic printing plate precursor of embodiment 10 wherein the tetraarylborate salt and the onium salt form the same salt.

12. The lithographic printing plate precursor of any of embodiments 1 to 11 wherein the support is an aluminum-containing support.

13. The lithographic printing plate precursor of any of embodiments 1 to 12 that is sensitive to radiation having a wavelength of from about 750 to about 1400 nm.

14. A method of providing a lithographic printing plate comprising:

A) imagewise exposing the lithographic printing plate precursor of any of embodiments 1 to 13 to provide exposed and non-exposed regions, and B) without a baking step, developing the imagewise exposed precursor to remove the non-exposed regions.

15. The method of embodiment 14 wherein lithographic printing plate precursor is imagewise exposed using a laser providing imaging radiation at 750 to 1250 nm.

16. The method of embodiment 14 or 15 wherein developing is carried out using a processing solution having a pH of from about 9 to 14.

17. The method of any of embodiments 14 to 16 wherein developing is carried out using a processing solution having a pH of at least 7 and up to 12.

18. The method of any of embodiments 14 to 17 wherein the lithographic printing plate precursor comprises an oxygen scavenger that is 4-(N,N-dimethylamino)benzoic acid, 4-(N,N-diethylamino)benzoic acid, 4-[N,N-bis(2-hydroxyethyl)amino]benzoic acid, N,N-dihydroxyethyl glycine, N,N-dihydroxymethyl glycine, or a mixture thereof that is present in an amount of from 1 to 7 weight %, wherein the infrared radiation absorbing compound is an infrared radiation absorbing dye, and the initiator composition further comprises a tetraarylborate salt and an onium salt that form the same salt.

19. A lithographic printing plate obtained from the method of any of embodiments 14 to 18.

The following examples are provided to illustrate the practice of this invention and are not meant to be limiting in any manner.

EXAMPLES

Comparative Example 1

Latex Synthesis Containing Polymer A:

A solution of poly (ethylene glycol) methyl ether methacrylate [40 g, PEGMA-50% solution in water (available from Aldrich)] dissolved in a mixture of 64.8 g of deionized water and 241.4 g of n-propanol, was charged into a 1000 ml 4-neck flask that was heated slowly to slight reflux at 76° C. under a nitrogen atmosphere. A pre-mixture of 20.0 g of styrene, 60.0 g of acrylonitrile, and 0.7 g of azoisobutyronitrile (Vazo-64, from Dupont de Nemours Co) was added over a two hour period. Six hours later, another 0.35 g of azoisobutyronitrile (Vazo-64) was added to the reaction mixture. The reaction temperature was then raised to 80° C. After 3 hours, 0.35 g of Vazo-64 were added and after 19 hours of reaction, the conversion to graft copolymer was found to be greater than 95% based on determination of percent non-volatiles. The resulting polymer latex is used directly in the preparation of the imageable layer coating formulations in the Examples below, where Polymer A represents essentially all of the solid components in the latex. The weight ratio of PEGMA/styrene/acrylonitrile was 20:20:60 in Polymer A that was present at 23.8% solids in n-propanol/water (ratio is 76:24). The particle size and distribution of the latex was measured using a Microtrac Ultrafine Particle Analyzer UPA 150 and dynamic light scattering. The average particle size of the latex particles was 295 nm and 90% of the particles had a diameter smaller than 400 nm.

Plate Coating and Evaluation:

A coating solution was made with the composition shown in TABLE I below. This formulation does not contain stabilizing compounds of Structure (I) or (II) according to this invention. The coating solution was made at 8% solids in water:phenoxyethanol:Dowanol® PM:MEK (methyl ethyl ketone) (22:0.3:9.2:68.5 weight ratio) and applied with a wire wound rod onto a sulfuric acid anodized aluminum substrate that had been treated with a poly(vinyl phosphonic acid) post-anodic treatment. The printing plate precursors were dried at 110° C. for 1 minute. The dry coating weight of the imageable layer was 1.65 g/m$^2$. One printing plate precursor was evaluated fresh immediately after coating and other printing plate precursors were evaluated after ageing for 5 days under dry conditions at 48° C. or under hot and humid conditions at 40° C. and 80% relative humidity (RH).

All of the printing plate precursors were imaged on a Kodak 3244x platesetter with an exposure series of energies from 40 mJ/cm$^2$ to 150 mJ/cm$^2$ at a power of 13 Watt. The imaged precursors were developed in SWD1 developer commercial developer (from Kodak Graphics Communications, Japan), 1+3 dilution (25% of its initial strength) at 5 ft/min (1.5 m/min) and 23° C. in a NE-34 processor. The optical density (OD) of the solid image was measured using an X-Rite spectrodensitometer model 500 fitted with a cyan filter. The OD was then plotted versus exposure energy. The point where the OD-energy curve changed slope and reached a plateau was considered to be the sensitivity of the printing plate precursors.

The freshly coated precursor and the precursor aged under humid conditions had a sensitivity of 60 mJ/cm$^2$ but the precursor aged under dry conditions had a lower sensitivity (higher imaging energy) of 90 mJ/cm$^2$ and exhibited coating retention in some areas not touched by the brushes in the processor (see TABLE II). The precursors were also subjected to an adhesion test in which a strip of commercial Scotch® brand tape was stuck to the 50% screen area by pressing carefully to eliminate any air that might have been trapped and then the tape was pulled off in one fast move. The screens were examined for chipping and the tape was examined for pulled-off material. The coating of the dry aged precursor not only exhibited a lower sensitivity but also showed a brittle behavior and loss of adhesion (chipping of the 50% screens) when tested with the adhesive tape. The precursor aged under dry conditions also had some areas of coating loss in 30%-99% screens.

TABLE I

| Compound | Supplier | % (Dry Coating) |
|---|---|---|
| Polymer A | | 40.75 |
| Ebecryl ® 220 | Cytec Industries | 40.75 |
| Bis(4-t-butylphenyl)iodonium tetraphenyl borate | | 7 |
| IR Dye I (structure below) | | 3.5 |
| Phosmer PE | Uni-Chemical | 2 |

TABLE I-continued

| Compound | Supplier | % (Dry Coating) |
|---|---|---|
| Mikuni pigment #454 | Mikuni Color Ltd | 5 |
| Byk ® 333 | Byk Chemie | 1 |

IR Dye I

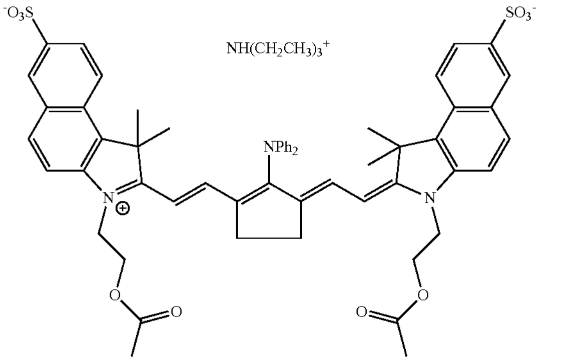

TABLE II

| Sensitivity (mJ/cm$^2$) | | |
|---|---|---|
| Freshly Coated | Dry Aged | Humidity Aged |
| 60 | 90 (brittle, adhesion loss, isolated coating retention) | 60 |

Comparative Example 2

A coating solution was made with the coating formulation shown in TABLE III below, which formulation does not contain oxygen scavenger compounds according to the present invention. The coating formulation was made at 8% solids in water:IPA:MEK (10:20:70 weight ratio). The formulation was then coated on a sulfuric anodized aluminum substrate that had been treated as in Comparative Example 1 using a slot die. The resulting lithographic printing plate precursors were dried at 110° C. for 1 minute. The printing plate precursors were evaluated fresh immediately after coating as well as after aging under dry and humid conditions as in Comparative Example 1 for 5 days. The precursors were imaged with an exposure series of energy between 40 mJ/cm$^2$ and 150 mJ/cm$^2$ using a Kodak® 3244x platesetter. The imaged precursors were developed in SWD1 developer, 1+2 dilution (33% of the original strength) at 5 ft/min (1.5 m/min) and 23° C. in NE-34 processor and the sensitivity was evaluated as in Comparative Example 1. The fresh and humidity-aged precursors had a sensitivity of 60 mJ/cm$^2$ and the dry aged precursors had a sensitivity of 90 mJ/cm$^2$ (see TABLE IV below). The dry aged precursors also looked brittle as observed in Comparative Example 1.

The lithographic printing plates were then mounted on a Miehle press and used for printing with a wear ink containing talc, OS Kodak #9, and a fountain solution made by mixing PAR fountain concentrate from Day International Inc. and Supreme Font 6038 each 4 oz/gallon water (30 g/liter). The freshly-coated printed plate printed 25,000 impressions, the humidity-aged printing plate was used to print 35,000 impressions, and the dry aged printing plate was used to print 10,000 impressions before any sign of wear could be seen in the solid surface.

The printing plates were also tested for chemical resistance to UV plate cleaner from Allied Pressroom Chemicals. A corner of the image was wiped with UV wash after 5,000 impressions and showed an attack of the image. The printing plates were also affected by cleaning them with plate cleaner/preserver Aqua Image from Kodak and storage overnight. If the printing plates were cleaned early in the printing run and then stored until next day, print durability was reduced. For example, if the fresh printing plate was cleaned after 5,000 impressions and then stored overnight, the durability decreased from 25,000 to 15,000 impressions.

TABLE III

| Compound | % (Dry Coating) |
|---|---|
| Polymer A | 43.25 |
| Ebecryl ® 220 | 43.25 |
| Bis(4-t-butylphenyl)iodonium tetraphenyl borate | 7 |
| IR Dye I | 3.5 |
| Phosmer PE | 2 |
| Byk ® 333 | 1 |

TABLE IV

| | Freshly Coated | Dry Aged | Humidity Aged |
|---|---|---|---|
| Sensitivity ($mJ/cm^2$) | 60 | 90 (brittle, adhesion loss, isolated coating retention) | 60 |
| Durability in print[1] | 35,000 | 10,000 | 35,000 |

[1]Number of sheets printed before a solid image started to wear off

Comparative Example 3

In this example, a known dissolution promoter and aging stabilizer, polyethylene glycol diacid (from Sigma Aldrich) described in U.S. Patent Application Publication 2009/0111051 (Tao et al.) was added at 5% level to the Formula 1 shown in TABLE I at the expense of polymer and monomer (see TABLE V below) with a hope of obtaining better developability. Dissolution promoters are compounds that contain polar groups that could speed up developability in an aqueous developer when added to the coating composition. All of the precursor making conditions and processing were identical to Comparative Example 1 except that 955 Developer was used for processing.

TABLE V

| | % (Dry Coating) | |
|---|---|---|
| Compound | Formula 1 | Formula 3B |
| Polymer A | 40.75 | 38.25 |
| Ebecryl ® 220 | 40.75 | 38.25 |
| Bis(4-t-butylphenyl)iodonium tetraphenyl borate | 7 | 7 |
| IR Dye I | 3.5 | 3.5 |
| Polyethylene glycol diacid | 0 | 5 |
| Phosmer PE | 2 | 2 |
| Mikuni pigment #454 | 5 | 5 |
| Byk ® 333 | 1 | 1 |

TABLE VI below shows the sensitivity of the printing plate precursors. The presence of the dissolution promoter polyethylene glycol diacid increased the imaging energy of the plates (reduced sensitivity), especially that of the dry aged precursor that increased from 90 $mJ/cm^2$ to 110 $mJ/cm^2$. The coating of the dry aged precursor also remained brittle. Thus, the use of polyethylene glycol diacid did not solve the problem of lower sensitivity and coating brittleness after dry ageing. On the contrary, it further lowered the sensitivity, caused adhesion loss, and introduced tackiness.

TABLE VI

| | Sensitivity ($mJ/cm^2$) | | |
|---|---|---|---|
| | Fresh Precursor | Dry Aged Precursor (48° C., 5 days) | Humidity Aged Precursor (40° C., 80% RH, 5 days) |
| Reference Formula 1 | 60 | 90 (brittle, adhesion loss, isolated coating retention) | 60 |
| Formula 1 + PEG diacid, 5% | 70 | 110 (more adhesion loss, tackiness) | 70 |

Comparative Example 4

Known dissolution promoters (procured from Aldrich Chemical) were tried at 5% level as shown in TABLE VII below. The coating solutions were made at 8% solids in BLO (γ-butyrolactone):water:PGME:MEK (10:20:19:51 weight ratio). The precursor making and processing conditions were identical to those in Comparative Example 1 except that 955 Developer was used. The results are shown below in TABLE VIII.

TABLE VII

| | % (Dry Coating) | | | | |
|---|---|---|---|---|---|
| Compound | Formula 1, Comparative Example 1 | Formula 4A | Formula 4B | Formula 4C | Formula 4D |
| Polymer A | 40.75 | 38.25 | 38.25 | 38.25 | 38.25 |
| Ebecryl ® 220 | 40.75 | 38.25 | 38.25 | 38.25 | 38.25 |
| Bis(4-t-butylphenyl)iodonium tetraphenyl borate | 7 | 7 | 7 | 7 | 7 |
| IR Dye I | 3.5 | 3.5 | 3.5 | 3.5 | 3.5 |
| Mikuni pigment # 454 | 5 | 5 | 5 | 5 | 5 |
| 4,4'-Oxydiphthalic anhydride | 0 | 5 | 0 | 0 | 0 |
| Pyromellitic dianhydride | 0 | 0 | 5 | 0 | 0 |
| N,N-anilinodiacetic acid | 0 | 0 | 0 | 5 | 0 |
| N-phenyl glycine | 0 | 0 | 0 | 0 | 5 |
| Phosmer PE | 2 | 2 | 2 | 2 | 2 |
| Byk ® 333 | 1 | 1 | 1 | 1 | 1 |

TABLE VIII

| | Dissolution | Sensitivity ($mJ/cm^2$) | | |
|---|---|---|---|---|
| Formula | promoter (or oxygen scavenger) | Fresh | Dry Aged | Humidity Aged |
| 1 | None | 60 | 90 (brittle, adhesion loss, isolated coating retention | 60 |
| 4A | 4,4'-Oxydiphthalic anhydride | >110 | >110 | 100 |

TABLE VIII-continued

| Formula | Dissolution promoter (or oxygen scavenger) | Sensitivity (mJ/cm$^2$) Fresh | Dry Aged | Humidity Aged |
|---|---|---|---|---|
| 4B | Pyromellitic dianhydride | >110 | >110 | >110 |
| 4C | N,N-anilinodiacetic acid | 70 | Coating retention | Toning, adhesion loss |
| 4D | N-phenyl glycine | 70 | Coating retention | Coating retention |

The dissolution promoters, 4,4'-oxydiphthalic anhydride and pyromellitic dianhydride, lowered the sensitivity to an unacceptable level (110 mJ/cm$^2$ and over). The dissolution promoters, N,N-anilinodiacetic acid (ADAA), and N-phenyl glycine, provided coating retention after dry and humid aging.

Comparative Example 5

In this example, oxygen scavengers N,N'-ethyleneurea (2-methyl imidazolidone) and N,N'-trimethyleneurea (tetrahydro-2(1H)-pyrimidinone) described in U.S. Patent Application Publication 2009/0111051 (noted above) were used. A pigment concentrate was prepared from Hostaperm Green GG-01 (Hoechst Celanese Corp.). The pigment concentrate had the composition pigment: Dysperbyk® 191:phenoxyethanol:PGME:water (10:2:8:26:54 weight ratio). Coating formulations with Formulae 5A, 5B, and 5C (TABLE IX below) were made at 8% solids in a solvent mixture of water: phenoxyethanol:Dowanol® PM:MEK (22:0.3:9.2:68.5 weight %). The printing plate precursors were made and evaluated according to the procedure described in Comparative Example 1 with the exception that developer SWD1 1+1 (50% of the original strength) was used for processing.

TABLE IX

| Compound | % (Dry Coating) Formula 5A | Formula 5B | Formula 5C |
|---|---|---|---|
| Polymer A | 41.75 | 39.25 | 39.25 |
| Ebecryl ® 220 | 41.75 | 39.25 | 39.25 |
| Bis(4-t-butylphenyl)iodonium tetraphenyl borate | 7 | 7 | 7 |
| IR Dye I | 3.5 | 3.5 | 3.5 |
| N,N'-ethyleneurea | 0 | 5 | 0 |
| N,N'-trimethyleneurea | 0 | 0 | 5 |
| Hostaperm Green GG-01 | 3 | 3 | 3 |
| Phosmer PE | 2 | 2 | 2 |
| Byk ® 333 | 1 | 1 | 1 |

Formulae 5B and 5C with oxygen scavengers were compared with Formula 5A without oxygen scavenger (see TABLE X below). The oxygen scavengers, N,N'-ethyleneurea and N,N'-trimethyleneurea, worsened image precursor developability after dry and humidity ageing.

TABLE X

| Precursor | Sensitivity (mJ/cm$^2$) Fresh | Dry Aged | Humidity Aged |
|---|---|---|---|
| 5A | 70 | 100 | 70 |
| 5B | 70 | coating retention | coating retention |
| 5C | 70 | coating retention | coating retention |

Invention Example 1

This example shows how the use of (dimethylamino)benzoic acid (DMABA, Alpha Aesar) as an oxygen scavenger according to this invention solved the problem of low sensitivity, brittleness and coating retention of the dry aged plate described in Comparative Example 1 while improving the sensitivity at the same time.

A pigment concentrate of Paliogen Blue L 6482 (from BASF) was prepared having the composition pigment: Dysperbyk® 191:phenoxyethanol:Dowanol® PM:water (10:2:8:30:50 weight %).

Two coating Formulae 1A and 1B in TABLE VI were prepared without and with 5% DMABA additive. The coating formulations were made at 8% solids in the solvent mixture water:phenoxyethanol:Dowanol® PM:MEK (22:0.3:9.2:68.5 weight %).

Sulfuric acid anodized aluminum plates with PVPA post-anodic treatment were coated using a slot die. The printing plate precursor were dried by passing them through a conveyor belt oven at 230° F. (110° C.) for 1 minute. The coating weight was determined as 1.65 g/m$^2$. The precursors were evaluated fresh after coating and after ageing under dry and humidity conditions at 48° C. and 40° C./80% RH, respectively for 5 days. The precursors were imaged using a Kodak® 3244x platesetter with an exposure series of energy between 40-150 mJ/cm$^2$ to determine sensitivity. The imaged precursors were developed using a developer concentrate, SWD1 diluted 1+3 (25% of its initial strength) in an NE-34 processor at 23° C. and 5 ft/min (1.5 m/min) speed. The measured optical density (OD) of the strips of various energies was plotted versus energy and the sensitivity of the plate was determined as the energy at which the curve attained its plateau. The sensitivity of the fresh and aged Comparative Example 1 precursor of (no DMABA) is given in TABLE XI below compared with the results for the precursor Invention Example 1 containing 5% DMABA. The fresh plate as well as the plates aged for 5 days in dry and humid conditions of the present invention had a sensitivity of 60 mJ/cm$^2$. The adhesion of the dry plate was determined by the adhesive tape test described above was as good as that of the fresh and humidity-tested plates. By comparison, the dry precursor without DMABA of the Comparative Example 1 had a lower sensitivity, 90 mJ/cm$^2$, and exhibited brittleness, screen plugging, and adhesion loss.

TABLE XI

| Component | % (Dry Coating) Formula 1A, Comparative Example 1 (0% DMABA) | Formula 1B (5% DMABA) |
|---|---|---|
| Polymer A | 40.75 | 38.25 |
| Ebecryl ® 220 | 40.75 | 38.25 |
| Bis(4-t-butylphenyl)iodonium tetraphenyl borate | 7 | 7 |
| IR Dye I | 3.5 | 3.5 |
| DMABA | 0 | 5 |
| Pigment Paliogen Blue L 6482 | 5 | 5 |
| Phosmer PE | 2 | 2 |
| Byk ® 333 | 1 | 1 |

TABLE XII

| | Sensitivity (mJ/cm²) | | |
|---|---|---|---|
| Precursor | Fresh | Dry aged | Humidity Aged |
| 1A (O % DMABA) | 70 | 90 (brittle, screen plugging, adhesion loss) | 60 |
| 1B (5% DMABA) | 70 | 70 | 60 |

Invention Example 2

Two coating solutions were made using the compounds shown in TABLE XIII below, with and without DMABA. The coating formulations were made at 8% solids in water:IPA: MEK (10:20:70 weight %). The formulations were coated on sulfuric acid anodized aluminum substrate (finished with PVPA) through a slot die and dried at 110° C. for 1 minute. The resulting printing plate precursors were aged under dry and humid conditions for 5 days at 48° C. and 40° C./80% RH, respectively. Fresh plates and aged plates were imaged using an exposure series between 40 mJ/cm$^2$ and 150 mJ/cm$^2$. The imaged precursors were developed in SWD1 developer, 1+2 dilution (33% of the original strength) at 5 ft/min (1.5 m/min) and 23° C. in NE-34 processor and the sensitivity was evaluated as described in Comparative Example 1.

TABLE XIII

| | % (Dry Coating) | |
|---|---|---|
| Compound | Formula 6A | Formula 6B |
| Polymer A | 43.25 | 40.75 |
| Ebecryl ® 220 | 43.25 | 40.75 |
| Bis(4-t-butylphenyl)iodonium tetraphenyl borate | 7 | 7 |
| IR Dye I | 3.5 | 3.5 |
| DMABA | 0 | 5 |
| Phosmer PE | 2 | 2 |
| Byk ® 333 | 1 | 1 |

Printing plate precursors made with Formulae 6A and 6B were imaged at 110 mJ/cm$^2$, developed as above, and mounted on a Miehle press. The printing plates were used for printing with a wear ink containing talc, OS Kodak #9 and a fountain solution made by mixing PAR fountain concentrate from Day International Inc. and Supreme Font 6038 each 4 oz/gallon water (30 g/liter). The printing plate precursors made from Formula 6B with 5% DMABA oxygen scavenger either freshly prepared or aged under dry and humid conditions printed 45,000 sheets before any sign of wear was seen in the solid image. The dot density of the 2%-50% screens measured with an X-rite spectrodensitometer model 500 equipped with cyan filter remained steady within 10% up to 35,000 printed sheets after which the dot density started to decrease fast.

The printing plates made with Formula 6B had chemical resistance to UV plate cleaner from Allied Pressroom Chemicals. A corner of the image was wiped with UV cleaner after each 5,000 impressions and it did not show any mark in print until after 35,000 impressions. The printing plates were not affected by cleaning with Kodak Aqua Image cleaner/preserver followed by overnight storage.

The printing plate precursors made using Formula 6A (without DMABA) had inferior performance, especially the dry aged plate that exhibited lower print durability, 10,000 impressions compared to 45,000 for the printing plate of this invention (see TABLE XIV below).

TABLE XIV

| Property | Plate | Freshly Coated | Dry aged | Humidity aged |
|---|---|---|---|---|
| Sensitivity, mJ/cm$^2$ | 6A (no DMBA) | 60 | 90 (brittle, adhesion loss, plugged screens in places) | 60 |
| Durability in print, # sheets | " | 35,000 | 10,000 | 35,000 |
| Sensitivity, mJ/cm$^2$ | 6B (5% DMBA) | 60 | 60 | 60 |
| Durability in print, # sheets | " | 45,000 | 45,000 | 45,000 |

Invention Example 3

This example uses the coating formulation used in Comparative Example 2 but with the addition of 5% bis(2-hydroxyethyl glycine) (BHEG) as an oxygen scavenger according to this invention. The coating formulations were made at 8% solids in water:IPA (isopropyl alcohol):MEK (20:20:60 weight %). The printing plate precursors were dried for 1 minute at 110° C. The printing plate precursors were evaluated fresh and aged under the same conditions as described in Comparative Example 2. However, the imaged plates in this example were developed using SWD1 developer, dilution 1+3 (25% of its original strength).

The coating formulation was applied to a sulfuric acid anodized aluminum substrate with a PVPA finish through a slot die and dried at 110° C. for 82 seconds to provide an imageable layer dry coating weight of 1.67 g/m$^2$. The precursors were aged under dry and humid conditions for 5 days at 48° C. and 40° C. and 80% RH, respectively. Fresh precursor and aged precursors were imaged using a series of energy between 40 mJ/cm$^2$ and 150 mJ/cm$^2$. The imaged precursors were developed using SWD1 developer, dilution 1+3 at 5 ft/min (1.5 m/min) at 23° C. in an NE-34 processor and the sensitivity was evaluated as in previous examples. The fresh, dry and humid aged printing plate precursors containing BHEG had a sensitivity of 60 mJ/cm$^2$ (see TABLE XV below). The adhesion that was determined by the adhesive tape test described above did not show any loss after ageing.

Printing plate precursors imaged at 110 mJ/cm$^2$ were mounted on a Miehle press and used for printing with a wear ink containing talc, OS Kodak #9 and a fountain solution made by mixing PAR fountain concentrate from Day International Inc. and Supreme Font 6038 each 4 oz/gallon water (30 g/liter). The fresh precursor and the dry aged precursor were used to print 45,000 impressions and the humid aged plate was used to print 35,000 impressions before any sign of wear could be seen in the solid image. The dot density of the 2-50% screens measured with an X-rite densitometer model 500 with cyan filter remained steady within 10% up to 35,000 impressions after which it started to decrease fast.

The printing plate precursors made with Formula 3B (invention with BHEG) had chemical resistance to UV plate wash. A corner of the image was wiped with UV wash at 5,000 sheet intervals and no wear was visible until after 35,000 impressions in the solid image. The printing plate precursors were not affected by cleaning with plate cleaner for overnight storage. The printing plate precursors prepared using Formula 3A without BHEG had a lower run length, especially the dry aged precursor that printed only 10,000 sheets (see TABLE XVI below) before wear was detected in the solid image.

TABLE XV

| Compound | % (Dry Coating) Formula 3A | Formula 3B |
|---|---|---|
| Polymer A | 43.25 | 40.75 |
| Ebecryl ® 220 | 43.25 | 40.75 |
| Bis(4-t-butylphenyl)iodonium tetraphenyl borate | 7 | 7 |
| IR Dye I | 3.5 | 3.5 |
| BHEG | 0 | 5 |
| Phosmer PE | 2 | 2 |
| Byk ® 333 | 1 | 1 |

TABLE XVI

| Precursor | Property | Freshly coated | Dry aged | Humidity aged |
|---|---|---|---|---|
| Formula 3A (No BHEG) | Sensitivity, mJ/cm$^2$ | 60 | 90 (brittle, adhesion loss, plugged screens in places) | 60 |
| Formula 3A (No BHEG) | Durability in print, # sheets | 35,000 | 10,000 | 35,000 |
| Formula 3B (5% BHEG)) | Sensitivity, mJ/cm$^2$ | 70 | 70 | 60 |
| Formula 3B (5% BHEG)) | Durability in print, # sheets | 45,000 | 45,000 | 35,000 |

Invention Example 4

A pigment concentrate of Paliogen Blue L 6482 (from BASF) was prepared having the composition pigment: Dysperbyk® 191:phenoxyethanol:Dowanol PM:water (10:2:8:30:50 weight %). Two coating formulations, Formulae 4A and 4B, shown in TABLE X were prepared using Rgen 1130, bis(4-methylphenyl)iodonium hexafluorophosphate initiator (Chitec Technology Co.) without and with 5% DMABA oxygen scavenger, respectively. The coating formulations were made at 8% solids in a solvent that had the final composition water:phenoxyethanol:Dowanol® PM:MEK (22:0.3:9.2:68.5 weight %).

The formulations were coated on a sulfuric acid anodized aluminum substrate finished with PVPA. The printing plate precursors were dried for 82 seconds at 110° C. to provide an imageable layer coating weight of 1.7 g/m$^2$. The printing plate precursors were aged and processed as in Comparative Example 1 except that the developer for processing was SWD1, 1+3 (25% of the initial strength).

TABLE XVII

| Component | % (Dry Coating) Formula 4A (No DMABA) | Formula 4B (5% DMABA) |
|---|---|---|
| Polymer A | 40.75 | 38.25 |
| Ebecryl ® 220 | 40.75 | 38.25 |
| Bis(4-t-butylphenyl)iodonium tetraphenyl borate | 7 | 7 |
| IR Dye I | 3.5 | 3.5 |
| DMABA | 0 | 5 |
| Pigment Paliogen Blue L 6482 | 5 | 5 |
| Phosmer PE | 2 | 2 |
| Byk ® 333 | 1 | 1 |

The printing plate precursors with Formula 4A (without DMABA) had coating retention after aging. The precursors with Formula 4B containing 5% DMABA (Invention) aged well and developed clean having a sensitivity of 60-70 mJ/cm$^2$ (see TABLE XVIII below).

TABLE XVIII

| Precursor | Sensitivity (mJ/cm$^2$) Fresh | Dry aged | Humidity Aged |
|---|---|---|---|
| Formula 4A (no DMABA) | 70 | coating retention | coating retention |
| Formula 4B (5% DMABA) | 60 | 70 | 60 |

Invention Example 5

A coating formulation was made containing diphenyl iodonium hexafluorophosphate initiator from Sigma-Aldrich instead of bis(4-t-butylphenyl)iodonium tetraphenyl borate with and without 5% DMABA oxygen scavenger. The formulations were made at 8% solids in solvent mixture of water:phenoxyethanol:Dowanol® PM:MEK (22:0.3:9.2:68.5 weight %). The printing plate precursors were aged, imaged, and developed as in Comparative Example 1 except that processing was carried out using the developer SWD1, diluted to 25% concentration with water.

TABLE XIX

| Component | % (Dry Coating) Formula 5A (No DMABA) | Formula 5B (5% DMABA) |
|---|---|---|
| Polymer A | 40.75 | 38.25 |
| Ebecryl ® 220 | 40.75 | 38.25 |
| Diphenyl iodonium hexafluorophosphate | 7 | 7 |
| IR Dye I | 3.5 | 3.5 |
| DMABA | 0 | 5 |
| Pigment Paliogen Blue L 6482 | 5 | 5 |
| Phosmer PE | 2 | 2 |
| Byk ® 333 | 1 | 1 |

TABLE XX

| Precursor | Sensitivity (mJ/cm$^2$) Fresh | Dry Aged | Humidity Aged |
|---|---|---|---|
| 5A (no DMABA) | 70 | 70 (screen plugging) | 60 |
| 5B (5% DMABA) | 70 | 70 | 60 |

The printing plate precursor made using Formula 5A (without DMABA) had a sensitivity of 70 mJ/cm$^2$ when fresh or after dry aging and 60 mJ/cm$^2$ after humidity aging. The dry aged plate has some areas of plugged screens, however. By using 5% DMABA as in Formula 5B, the screen plugging problem was solved while the sensitivity was preserved.

Invention Example 6

A coating formulation was made containing diphenyl arsenonium hexafluorophosphate initiator in two variations, with and without DMABA oxygen scavenger. The formulations were made at 8% solids in water:phenoxyethanol:Dowanol® PM:MEK (22:0.3:9.2:68.5 weight %). The printing plate precursors were prepared on sulfuric acid anodized aluminum substrates and dried at 110° C. for 82 seconds. The precursors were aged, imaged, and evaluated as in Comparative Example 1. The only difference was that the processing was carried out using SWD1, 1+3 (25%).

TABLE XXI

| | % (Dry Coating) | |
|---|---|---|
| Component | Formula 6A (No DMABA) | Formula 6B (5% DMABA) |
| Polymer A | 40.75 | 38.25 |
| Ebecryl ® 220 | 40.75 | 38.25 |
| Diphenyl arsenonium hexafluorophosphate | 7 | 7 |
| IR Dye I | 3.5 | 3.5 |
| DMABA | 0 | 5 |
| Pigment Paliogen Blue L 6482 | 5 | 5 |
| Phosmer PE | 2 | 2 |
| Byk ® 333 | 1 | 1 |

TABLE XXII

| | | Sensitivity (mJ/cm$^2$) | | |
|---|---|---|---|---|
| Precursor | Additive | Fresh | Dry Aged | Humidity Aged |
| 6A | No DMABA | 70 | 60 (some screen plugging) | 60 |
| 6B | 5% DMABA | 70 | 60 | 60 |

The printing plate precursors prepared without DMABA (Formula 6A) exhibited screen plugging in some areas. The problem was solved through the use of 5% DMABA as in Formula 6B (Invention).

Invention Example 7

SR 399 from Sartomer was used instead of Ebecryl® 220 and BHEG instead of DMABA as the oxygen scavenger. The imaged printing plate precursors (TABLE XXIII) were developed using SWD1, 1+4 (20% of the original strength) in an NE-34 processor at 5 ft/min (1.5 m/min) and 23° C. The evaluation of sensitivity was performed as described in Comparative Example 1 and shown below in TABLE XXIV.

TABLE XXIII

| | % (Dry Coating) | |
|---|---|---|
| Component | Formula 8A (No DMABA) | Formula 8B (5% DMABA) |
| Polymer A | 40.75 | 38.25 |
| SR 399 | 40.75 | 38.25 |
| Bis(4-t-butylphenyl)iodonium tetraphenyl borate | 7 | 7 |
| IR Dye I | 3.5 | 3.5 |
| BHEG | 0 | 5 |
| Pigment Paliogen Blue L 6482 | 5 | 5 |
| Phosmer PE | 2 | 2 |
| Byk ® 333 | 1 | 1 |

TABLE XXIV

| | | Sensitivity (mJ/cm$^2$) | | |
|---|---|---|---|---|
| Precursor | Additive | Fresh | Dry Aged | Humidity aged |
| 8A | No BHEG | 70 | 90 (some coating retention) | 60 (some coating retention) |
| 8B | 5% BHEG | 70 | 60 | 60 |

Printing plate precursors prepared using Formula 8A (without BHEG) exhibited lower sensitivity (90 mJ/cm$^2$) after dry aging as well as coating retention after aging under dry and humid conditions. The use of 5% BHEG (Invention) improved the sensitivity of dry aged precursor bringing it to 60 mJ/cm$^2$ and eliminated the problem of coating retention.

Invention Example 8

In this example IR dye S0507 from Few was used instead of IR Dye I in Formulae 9A and 9B shown in TABLE XXV below. The resulting printing plate precursors were imaged and described above and developed in SWD1, 1+4 (20% of the original strength) using an NE-34 processor at 5 ft/min (1.5 m/min) and 23° C. The evaluation of sensitivity was performed as described in Comparative Example 1 and the results are shown below in TABLE XXVI.

TABLE XXV

| | % (Dry Coating) | |
|---|---|---|
| Component | Formula 9A (No DMABA) | Formula 9B (5% DMABA) |
| Polymer A | 40.75 | 38.25 |
| Ebecryl ® 220 | 40.75 | 38.25 |
| Bis(4-t-butylphenyl)iodonium tetraphenyl borate | 7 | 7 |
| S0507 IR Dye | 3.5 | 3.5 |
| DMABA | 0 | 5 |
| Pigment Paliogen Blue L 6482 | 5 | 5 |
| Phosmer PE | 2 | 2 |
| Byk ® 333 | 1 | 1 |

TABLE XXVI

| | | Sensitivity (mJ/cm$^2$) | | |
|---|---|---|---|---|
| Precursor | Additive | Fresh | Dry Aged | Humidity Aged |
| 9A | No DMABA | 80 | 80 (some coating retention) | 60 (some coating retention) |
| 9B | 5% DMABA | 70 | 60 | 60 |

Once again, the addition of 5% DMABA as the oxygen scavenger according to the present invention improved the sensitivity of the printing plate precursor that was aged under dry conditions by reducing the imaging energy from 80 $mJ/cm^2$ to 60 $mJ/cm^2$. At the same time, it solved the problem of coating retention after aging under dry and humid conditions.

Invention Example 10

An initiator composition containing a mixture of diphenylsulfonium hexafluorophosphates (Chivacure 1190 from Chitec) was used in this example. The printing plate precursors were prepared using the Formulae 10A and 10B shown in TABLE XXVII and were processed using the developer SWD1, 1+4 (20% of the original strength) in an NE-34 processor at 5 ft/min (1.5 m/min) and 23° C. The evaluation of sensitivity was as described in Comparative Example 1 and the results are shown below in TABLE XXVIII.

TABLE XXVII

| | % (Dry Coating) | |
|---|---|---|
| Component | Formula 10A (No BHEG) | Formula 10B (5% BHEG) |
| Polymer A | 40.75 | 38.25 |
| Ebecryl 220 | 40.75 | 38.25 |
| Chivacure 1190 | 7 | 7 |
| IR Dye I | 3.5 | 3.5 |
| BHEG | 0 | 5 |
| Pigment Paliogen Blue L 6482 | 5 | 5 |
| Phosmer PE | 2 | 2 |
| Byk ® 333 | 1 | 1 |

TABLE XXVIII

| | | Sensitivity ($mJ/cm^2$) | | |
|---|---|---|---|---|
| Precursor | Additive | Fresh | Dry Aged | Humidity Aged |
| 9A | No BHEG | 80 | 80 (some coating retention) | 60 (some coating retention) |
| 9B | 5% BHEG | 60 | 60 | 60 |

The use of 5% BHEG as an oxygen scavenger (Invention) improved the sensitivity of the printing plate precursor that had been aged under dry conditions by 20 $mJ/cm^2$ and eradicated the problem of coating retention after dry and humid aging.

The invention has been described in detail with particular reference to certain preferred embodiments thereof, but it will be understood that variations and modifications can be effected within the spirit and scope of the invention.

The invention claimed is:

1. A negative-working lithographic printing plate precursor comprising a substrate and having thereon a negative-working imageable layer as the outermost layer, the imageable layer comprising:

a) a polymeric binder, b) a free radically polymerizable component, c) an initiator composition that provides free radicals upon exposure to imaging radiation, and d) an oxygen scavenger and shelf-life stabilizer that is represented by either Structure (I) or Structure (II) below:

$$HOOC—Ar—N(R_1)(R_2) \quad (I)$$

$$HOOC—R_5—N(R_6)(R_7) \quad (II)$$

wherein Ar is a phenylene or naphthylene group, $R_1$ and $R_2$ are independently alkyl, alkenyl, alkynyl, phenyl, phenoxy, —$R_5$OH, —$CH_2$—C(═O)—$R_3$, or —$CH_2$—C(═O)O—$R_4$ groups, $R_3$ is hydrogen or an alkyl or phenyl group, $R_4$ is an alkyl or phenyl group, $R_5$ is an alkylene group, $R_6$ and $R_7$ are independently hydrogen or an alkyl, —$R_5$OH, —$R_5$C(═O)—$R_8$, or —$R_5$C(═O)O$R_9$ group, $R_8$ is hydrogen or an alkyl group, and $R_9$ is an alkyl group, provided that the oxygen scavenger has no more than one carboxyl group.

2. The lithographic printing plate precursor of claim 1 wherein Ar is phenylene, $R_1$ and $R_2$ are independently unsubstituted alkyl or hydroxyalkyl having 1 to 4 carbon atoms, $R_5$ is an alkylene having 1 to 4 carbon atoms, $R_6$ and $R_7$ are independently hydrogen or an alkyl group having 1 to 4 carbon atoms or an —$R_5$OH group wherein $R_5$ is an alkylene group having 1 to 4 carbon atoms.

3. The lithographic printing plate precursor of claim 2 wherein $R_1$ and $R_2$ are independently alkyl groups having 1 to 3 carbon atoms, $R_5$ is an alkylene having 1 or 2 carbon atoms, and $R_6$ and $R_7$ are independently —$R_5$OH groups wherein $R_5$ is an alkylene group having 1 or 2 carbon atoms.

4. The lithographic printing plate precursor of claim 1 wherein the oxygen scavenger is 4-(N,N-dimethylamino) benzoic acid, 4-(N,N-diethylamino)benzoic acid, 4-[N,N-bis (2-hydroxyethyl)amino]benzoic acid, N,N-dihydroxyethyl glycine, N,N-dihydroxymethyl glycine, or a mixture thereof.

5. The lithographic printing plate precursor of claim 1 wherein the oxygen scavenger is present in an amount of from about 0.1 to about 20 weight %.

6. The lithographic printing plate precursor of claim 1 wherein the oxygen scavenger is present in an amount of from 1 to 7 weight %.

7. The lithographic printing plate precursor of claim 1 wherein the polymeric binder is present as discrete particles having an average diameter of from 50 nm to 1 μm.

8. The lithographic printing plate precursor of claim 1 wherein the initiator composition comprises an onium salt and an infrared radiation absorbing compound.

9. The lithographic printing plate precursor of claim 8 wherein the infrared radiation absorbing compound is an infrared radiation absorbing dye.

10. The lithographic printing plate precursor of claim 8 wherein the initiator composition further comprises a tetraarylborate salt.

11. The lithographic printing plate precursor of claim 10 wherein the tetraarylborate salt and the onium salt form the same salt.

12. The lithographic printing plate precursor of claim 1 wherein the substrate is an aluminum-containing substrate.

13. The lithographic printing plate precursor of claim 1 that is sensitive to radiation having a wavelength of from about 750 to about 1400 nm.

14. A method of providing a lithographic printing plate comprising:

A) imagewise exposing the lithographic printing plate precursor of claim 1 to provide exposed and non-exposed regions, and B) without a baking step, developing the imagewise exposed precursor to remove the non-exposed regions.

15. The method of claim 14 wherein lithographic printing plate precursor is imagewise exposed using a laser providing imaging radiation at 750 to 1250 nm.

16. The method of claim 14 wherein developing is carried out using a processing solution having a pH of at least 6 and up to 14.

17. The method of claim 14 wherein developing is carried out using a processing solution having a pH of at least 7 and up to 12.

18. The method of claim 14 wherein the lithographic printing plate precursor comprises an oxygen scavenger that is 4-(N,N-dimethylamino)benzoic acid, 4-(N,N-diethylamino) benzoic acid, 4-[N,N-bis(2-hydroxyethyl)amino]benzoic acid, N,N-dihydroxyethyl glycine, N,N-dihydroxymethyl glycine, or a mixture thereof that is present in an amount of from 1 to 7 weight %, wherein the infrared radiation absorbing compound is an infrared radiation absorbing dye, and the initiator composition further comprises a tetraarylborate salt and an onium salt that form the same salt.

* * * * *